(12) United States Patent
Shukh

(10) Patent No.: US 8,373,438 B2
(45) Date of Patent: Feb. 12, 2013

(54) NONVOLATILE LOGIC CIRCUIT

(76) Inventor: Alexander Mikhailovich Shukh, Savage, MN (US)

( * ) Notice: Subject to any disclaimer, the term of this patent is extended or adjusted under 35 U.S.C. 154(b) by 0 days.

(21) Appl. No.: 13/283,465

(22) Filed: Oct. 27, 2011

(65) Prior Publication Data

US 2012/0105105 A1    May 3, 2012

Related U.S. Application Data

(60) Provisional application No. 61/408,550, filed on Oct. 29, 2010.

(51) Int. Cl.
*G06F 7/38* (2006.01)
*H03K 19/173* (2006.01)

(52) U.S. Cl. ............. 326/37; 326/38; 326/104; 326/121

(58) Field of Classification Search .................. None
See application file for complete search history.

(56) References Cited

U.S. PATENT DOCUMENTS

| | | | |
|---|---|---|---|
| 3,356,858 A | 12/1967 | Wanlass | |
| 6,147,922 A | 11/2000 | Hurst, Jr. et al. | |
| 6,175,525 B1 | 1/2001 | Fulkerson et al. | |
| 6,542,000 B1 | 4/2003 | Black et al. | |
| 7,054,190 B2 | 5/2006 | Hanyu et al. | |
| 7,082,053 B1 | 7/2006 | Jenne et al. | |
| 7,130,206 B2 | 10/2006 | Ferrant | |
| 7,206,217 B2 | 4/2007 | Ohtsuka et al. | |
| 7,221,600 B2 | 5/2007 | Hara et al. | |
| 7,256,616 B1 | 8/2007 | Agan et al. | |
| 7,271,643 B2 | 9/2007 | Robinson et al. | |
| 7,339,818 B2 | 3/2008 | Katti et al. | |
| 7,397,285 B2 | 7/2008 | Agan et al. | |
| 7,492,629 B2 | 2/2009 | Sugibayashi et al. | |
| 7,880,502 B2 | 2/2011 | Kawakami et al. | |
| 7,894,248 B2 | 2/2011 | Yu et al. | |
| 7,933,144 B2 | 4/2011 | Bangert et al. | |
| 8,004,882 B2 | 8/2011 | Katti et al. | |
| 2004/0164764 A1* | 8/2004 | Buchmann et al. | 326/37 |
| 2009/0109734 A1* | 4/2009 | Hanafi | 365/158 |
| 2010/0039136 A1 | 2/2010 | Chua-Eoan et al. | |

OTHER PUBLICATIONS

W.C.Black, Jr and B.Das, Programmable logic using giant-magnetoresistance . . . , J.Appl.Physics, v.87, No. 9, p. 6674 (2000).
K.J.Hass et al., Magnetic flip flops for space applications, IEEE Trans.Magnetics, v.42, No. 10, p. 2751 (2006).
S.Matsunaga et al., Fabrication of nonvolatile full adder based on logic-in-memory . . . , Applied Physics Express, v.1, 091301 (2008).
T.Uemura and M.Yamamoto, Three-valued magnetic tunnel junction for nonvolatile . . . , J.Appl.Physics, v.104, 123911 (2008).
Y.Shuto et al., Nonvolatile static random access memory based on spin-transistor achitecture, J.Appl.Physics, v.105, 07C933 (2009).
W.Zhao et al., Power and area optimization for run-time reconfiguration system . . . , IEEE Trans.Magnetics, v.45, No. 2, p. 776 (2009).
W.Zhao et al., High speed, high stability and low power sensing amplifier for MTJ/CMOS . . . , IEEE Trans.Magnetics, v.45, No. 10, p. 3784 (2009). G.Prenat et al., Beyond MRAM, CMOS/MTJ integration for logic components, IEEE Trans.Magnetics, v.45, No. 10, p. 3400 (2009).
K.Lee and S.H.Kang, Development of embedded STT-MRAM for mobile system-on-chip, IEEE Trans.Magnetics, v.47, No. 1, p. 131 (2011).

* cited by examiner

Primary Examiner — Anh Tran

(57) ABSTRACT

Semiconductor industry seeks to replace traditional volatile logic and memory devices with the improved nonvolatile devices. The increased demand for a significantly advanced, efficient, and nonvolatile data retention technique has driven the development of magnetic tunnel junctions (MTJs) employing a giant magneto-resistance (GMR). The present application relates to nonvolatile logic circuits with integrated MTJs and, in particular, concerns a nonvolatile spin dependent logic device that may be integrated with conventional semiconductor-based logic devices to construct the nonvolatile logic circuits performing NOT, NOR, NAND and other logic functions.

19 Claims, 13 Drawing Sheets

NONVOLATILE LOGIC CIRCUIT

CROSS-REFERENCE TO RELATED APPLICATIONS

This application claims the benefit of provisional patent application No. 61/408,550, filed on Oct. 29, 2010 by the present inventor.

FEDERALLY SPONSORED RESEARCH

Not Applicable

SEQUENCE LISTING OR PROGRAM

Not Applicable

RELEVANT PRIOR ART

U.S. Pat. No. 3,356,858, Dec. 5, 1967—Wanlass.
U.S. Pat. No. 7,339,818, Mar. 4, 2008—Katti et al.
U.S. Pat. No. 7,894,248, Feb. 22, 2011—Yu et al.
U.S. Pat. No. 8,004,882, Aug. 23, 2011—Katti et al.
U.S. Patent Application Publication No. 2010/0039136, Feb. 18, 2010—Chua-Eoan et al.

BACKGROUND

A logic gate is an arrangement of electronically controlled switches used to proceed calculations in Boolean algebra. Logic gates can be constructed from relays, diodes, transistors and other elements. The logic gates constructed from the metal-oxide-semiconductor (MOS) transistors represent basic components of digital integrated circuits (ICs). The MOS logic gates are programmable and can perform different logic functions such as NOT, AND, OR, NAND, NOR and others.

FIG. 1 shows a circuit diagram of a complementary MOS (CMOS) inverter (or a logic gate) 10 for performing a NOT logic function according to a prior art disclosed by F. Wanlass in U.S. Pat. No. 3,356,858 (1967). The inverter 10 comprises a n-channel MOS transistor nT coupled to a low source voltage 12 ($V_{SS}$) and a p-channel MOS transistor pT coupled to a high source voltage 14 ($V_{DD}$). An input signal A applied to an input terminal 16 controls the nT and pT transistors. The inverter 10 performs the logic function NOT. An output signal Y at an output terminal 18 is an inversion of the input signal A (Y=A'). The CMOS inverter 10 found a broad application in digital ICs to perform the logic functions AND, OR, NAND, NOR and others. However the CMOS inverter 10 is volatile and loses its logic state when the power is off.

Alternatively, a magnetic tunnel junction (MTJ) is a nonvolatile magneto-resistive device (MRD) employing giant magneto-resistance (GMR) effect observed in a multilayer structure composed by at least two ferromagnetic layers separated by a thing oxide layer. When magnetizations of the ferromagnetic layers are parallel to each other, a tunneling resistance $R_P$ of the MTJ is low and is referred to as a logic state "0". When the magnetizations of the ferromagnetic layers are anti-parallel, the resistance $R_{AP}$ of the MTJ is high and is referred to as a logic state "1". In the MTJ one ferromagnetic layer, called a pinned or reference layer, has a fixed direction of the magnetization. The direction of the magnetization in the other layer that is called as a free or storage layer can be reversed from parallel to anti-parallel relatively to the direction of the magnetization in the pinned layer by applying an appropriate magnetic field or by running a spin polarized current through the MTJ in a direction perpendicular to a plane of the junction. The logic states "0" or "1" can be determined by comparing the resistance of the MTJ with a known reference resistance. The MTJ is a nonvolatile device. It doesn't lose its logic state when the power is off.

FIG. 2 shows a circuit diagram of a nonvolatile inverter 20 according to a prior art disclosed by R. Katti and T. Zhu in U.S. Pat. No. 7,339,818 (2008) and No. 8,004,882 (2011). The inverter 20 comprises a MTJ 22 that is coupled in series between two complimentary MOS transistors nT and pT. A logic state of the inverter 20 stores in the MTJ 22 and cannot be lost when the power is off. The MTJ 22 employs a spin polarized current for changing its logic state. Hence the logic state of the MTJ 22 can be controlled by a direction of the spin polarized current running through the junction during programming. To reverse the direction of the spin polarized current in the MTJ 22 the polarity of voltage sources 12 ($V_{SS}$) and 14 ($V_{DD}$) needs to be changed. A necessity to change the polarity of the voltages sources during an operation in the nonvolatile inverter 20 leads to several disadvantages.

For example, the CMOS inverter requires that a source terminal of the p-channel pT and n-channel nT transistors be connected to the high voltage source ($V_{DD}$) and to the low voltage source ($V_{SS}$), respectively. The opposite polarity of the voltage sources is not desirable since it leads to a substantial increase of power consumption by the inverter due to a power leakage in the transistors. Moreover the opposite polarity of the voltage sources might cause a reduction of a saturation current of the transistors nT and pT. This obstacle might prevent the magnetization reversal in the MTJ 22 of the nonvolatile inverter 20 hence it might prevent the MTJ 22 from memorizing the logic state of the CMOS logic circuit formed by the transistors.

SUMMARY

This application describes, among other features, techniques, devices and circuits based on magnetic or magneto-resistive tunnel junctions. A nonvolatile logic circuit may comprise, a metal-oxide-semiconductor (MOS) logic circuit comprising, a first source terminal, a second source terminal, at least one input terminal, and an output terminal, to temporarily store a selective logic state with a volatile, power dependent status. The MOS logic circuit may be connected to a low voltage source by the first source terminal and to a high voltage source by the second source terminal. In addition, the nonvolatile logic circuit may further comprise at least one spin dependent magneto-resistive device (MRD), wherein the MRD may be connected to the output terminal at its first end and to an intermediate voltage source at its second end, and wherein a potential of the intermediate voltage source is higher than that of the low voltage source but lower than that of the high voltage source. The MRD may comprise at least a free ferromagnetic layer with a reversible magnetization direction, a pinned ferromagnetic layer with a fixed magnetization direction, and a tunnel barrier layer. The MRD may have at least two logic states, which depend on a mutual orientation of the magnetization directions in the free and pinned layers. The logic state of the MRD can be controlled by the MOS logic circuit to store the selective logic state with a nonvolatile, power independent status.

In one aspect, a nonvolatile logic circuit may utilize a complementary metal-oxide-semiconductor (CMOS) inverter, as a MOS logic circuit. The CMOS inverter may comprise a n-channel MOS transistor and a p-channel MOS transistor connected in series, an input terminal, an output terminal, and a MRD. A source terminal of the n-channel transistor may be connected to a low voltage source, and a source terminal of the p-channel transistor may be connected to a high voltage source. Gate terminals of the n-channel and p-channel transistors may be connected in common and to the input terminal, and drain terminals of the n-channel and p-channel transistors may be connected in common and to the output terminal. The MRD may be connected to the output terminal at its first end and to an intermediate voltage source at its second end, wherein a free ferromagnetic layer may be disposed adjacent the second end, and wherein a potential of the intermediate voltage source may be higher than that of the low voltage source but lower than that of the high voltage source. The nonvolatile logic circuit may perform a logic function NOT.

In another aspect, a nonvolatile logic circuit may include the CMOS inverter and the MRD disclosed above, wherein the free ferromagnetic layer is disposed adjacent the first end, which is connected to the output terminal. The nonvolatile logic circuit according to the another aspect may perform as a nonvolatile buffer.

In yet another aspect, a nonvolatile logic circuit may comprise a CMOS NAND logic gate, as a MOS logic circuit. The CMOS NAND gate may comprise a pull-down circuit comprising at least two n-channel MOS transistors connected in series, a pull-up circuit comprising at least two p-channel MOS transistors connected in parallel, an output terminal, at least two input terminals, and a MRD. A source terminal of the pull-down circuit can be connected to a low voltage source. A source terminal of the pull-up circuit can be connected to a high voltage source. A gate terminal of one n-channel transistor and a gate terminal of one n-channel transistor can be connected in common and to one of the input terminals. A gate terminal of another p-channel transistor and a gate terminal of another n-channel transistor can also be connected in common and to another input. A drain terminal of the pull-down circuit and a drain terminal of the pull-up circuit can be connected in common and to the output terminal. The MRD can be connected to the output terminal at its first end and to an intermediate voltage source at its second end, wherein a free ferromagnetic layer of the MRD can be disposed adjacent the second end, and wherein a potential of the intermediate voltage source can be higher than that of the low voltage source but lower than that of the high voltage source. The nonvolatile logic circuit can perform as a nonvolatile NAND logic gate.

Depending on particular aspects of the MOS logic circuit and a structure of the MRD, the nonvolatile logic circuits may perform other logic functions.

These and other aspects and implementations, their variations and modifications are described in greater detail in the attached drawings, the detailed description, and the claims.

BRIEF DESCRIPTION OF THE DRAWINGS

In the following drawings closely related figures have the same number but different alphabetic suffixes.

EXPLANATION OF REFERENCE NUMERALS

| | |
|---|---|
| nT, nTA, nTB | n-channel MOS transistor |
| pT, pTA, pTB | p-channel MOS transistor |
| 10 | volatile CMOS inverter (prior art) |
| 12 | low voltage source $V_{SS}$ |
| 14 | high voltage source $V_{DD}$ |
| 16, 16A, 16B, . . . , 16N | input terminal |
| 18 | output terminal |
| 20 | nonvolatile logic circuit (prior art) |
| 22, 22A, 22B, 22C, 22D | magnetic tunnel junction (or magneto-resistive device) |
| 30, 60, 80, 90, 100, 110, 120, 130 | nonvolatile logic circuit |
| 31, 31C | free (or storage) ferromagnetic layer |
| 32, 32A, 32B, 42, 42A, 42B | source terminal |
| 33, 33C | pinned (or reference) ferromagnetic layer |
| 34, 34A, 34B, 44, 44A, 44B | drain terminal |
| 35 | tunnel barrier layer |
| 36, 36A, 36B, 46, 46A, 46B | gate terminal |
| 38 | intermediate (or medium) voltage source VM |
| 51 | substrate |
| 52, 62 | source region |
| 53 | well |
| 54, 64 | drain region |
| 56A, 56B, 56C, 58 | contact |
| 124 | pull-down circuit |
| 126 | pull-up circuit |
| 137 | CMOS logic circuit |

DETAILED DESCRIPTION

Figure 1:
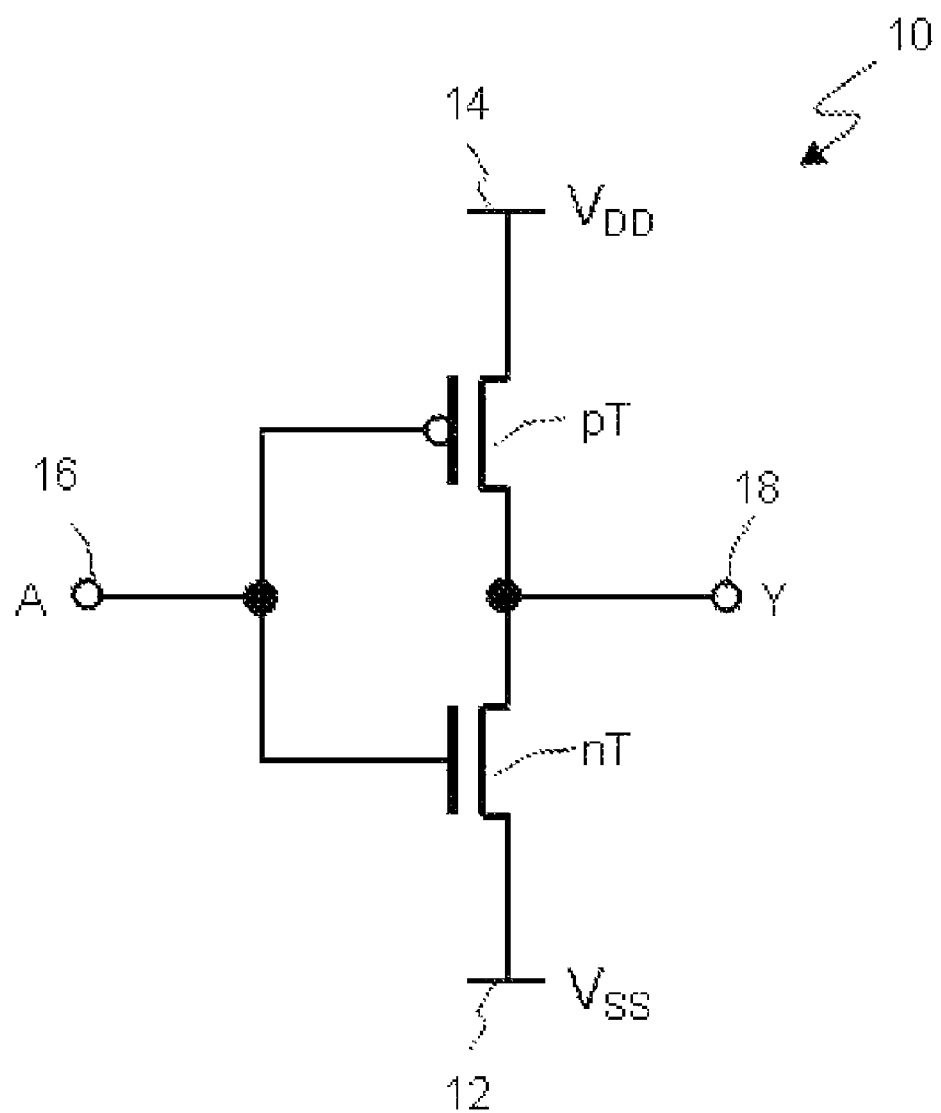
FIG. 1 is circuit diagram of a volatile CMOS inverter according to a prior art.
Figure 2:
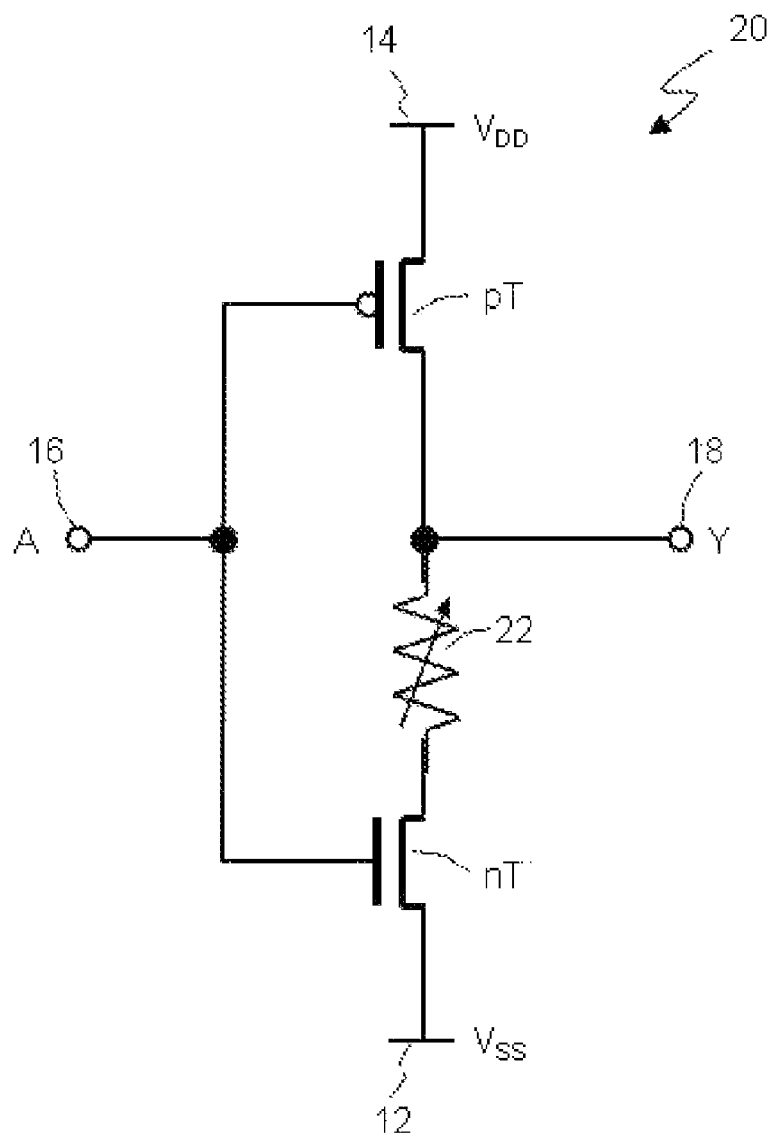
FIG. 2 is a circuit diagram of a nonvolatile logic circuit with a magneto-resistive device according to a prior art.
Figure 3:
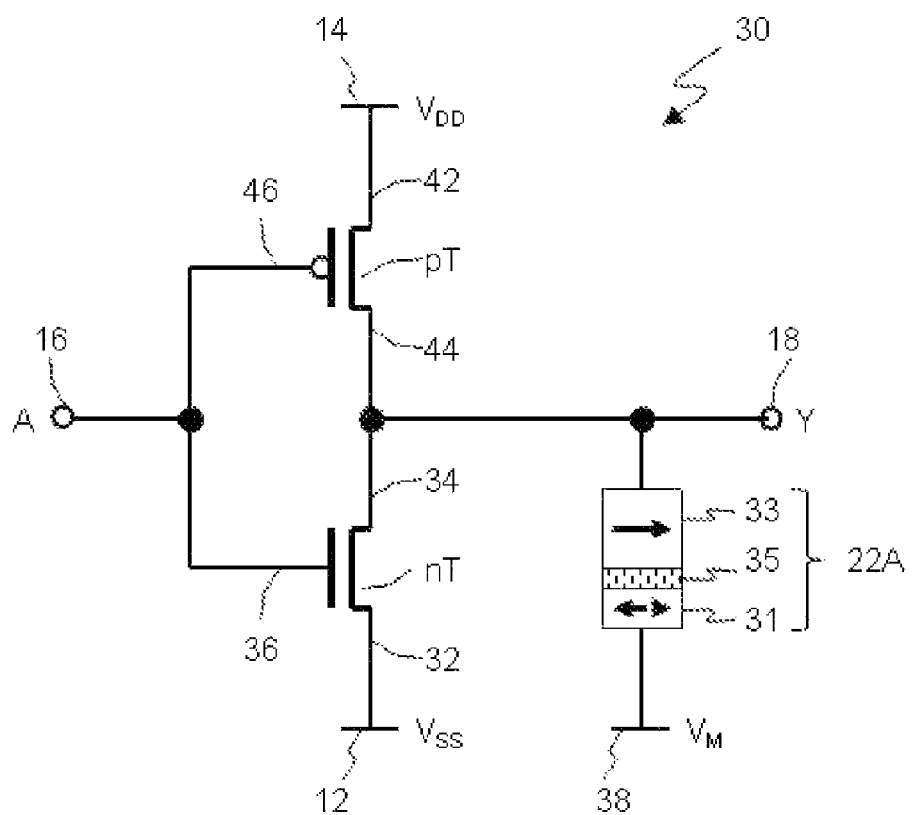
FIG. 3 is a circuit diagram of a nonvolatile inverter according to a first embodiment.

FIG. 3 illustrates a circuit diagram of a nonvolatile inverter 30 according to a first embodiment. The inverter 30 represents a nonvolatile logic circuit (or gate) that performs a logic function NOT. The inverter 30 comprises a n-channel MOS transistor nT and a complementary p-channel MOS transistor pT connected in series, and a magnetic tunnel junction (MTJ) 22A. A source terminal 32 of the nT transistor is connected to a low voltage source 12 ($V_{SS}$). Alternatively, a source terminal 42 of the pT transistor is connected to a high voltage source 14 ($V_{DD}$). Drain terminals 34 and 44 of the nT and pT transistors, respectively, are connected in common and to an output terminal 18. Gate terminals 36 and 46 of the nT and pT transistors, respectively, are connected in common and to an input terminal 16. The MTJ 22A is connected to the output terminal 18 at its first end and to an intermediate (or medium) voltage source 38 ($V_M$) at its second end. There is a following relation between potentials of the voltage sources $V_{DD}$, $V_M$ and $V_{SS}$: $V_{DD} > V_M > V_{SS}$. Hence the potential of the voltage source $V_{SS}$ is the lowest and the potential of the voltage source $V_{DD}$ is the highest. The potential of the voltage source 38 can be equal to $V_M = (V_{DD} - V_{SS})/2$. If the low source 12 is connected to a ground terminal ($V_{SS} = 0$), the potential of the voltage source 38 can be equal to $V_M = V_{DD}/2$.

The nonvolatile MTJ 22A comprises at least a free (or storage) layer 31, a pinned (or reference) layer 33, and a tunnel barrier layer 35 disposed between the ferromagnetic layers 31 and 33. In the first embodiment shown in FIG. 3 the free layer 31 is disposed adjacent the voltage source 38, and the pinned layer 33 is disposed adjacent the output terminal 18 and the drain terminals 34 and 44 of the nT and pT transistors. For exemplary purpose, the ferromagnetic layers 31 and 33 of the MTJ 22A are shown to have an in-plane magnetization. Direction of the magnetization in the free 31 and pinned 33 layers are shown by arrows. The direction of the magnetization in the pinned layer 33 (shown by solid arrow) is fixed by a manner generally known in the art, for example, by means of exchange coupling with an antiferromagnetic layer (not shown) or others. The magnetization in the free layer 31 (shown by dashed arrow) can be controlled. It has two stable states that are parallel or anti-parallel to the direction of the magnetization in the pinned layer 33. The direction of the magnetization in the free layer 31 can be reversed by means of a spin polarized current running through the MTJ 22A in a direction perpendicular to the layers plane; by an external magnetic field, or by other methods.

Figure 4A:
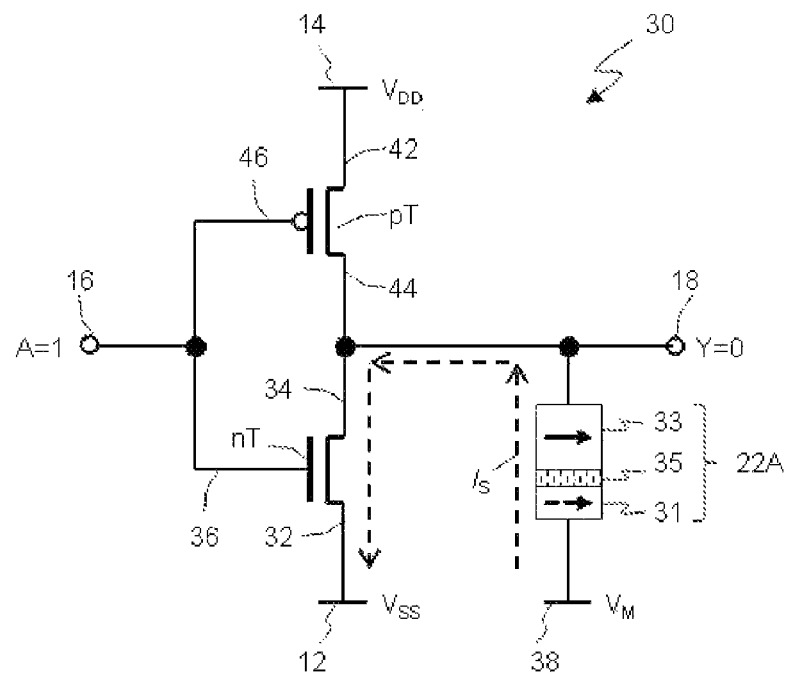
FIGS. 4A and 4B illustrate a circuit diagram for describing a write operation of the nonvolatile inverter shown in the FIG. 3.
Figure 4B:
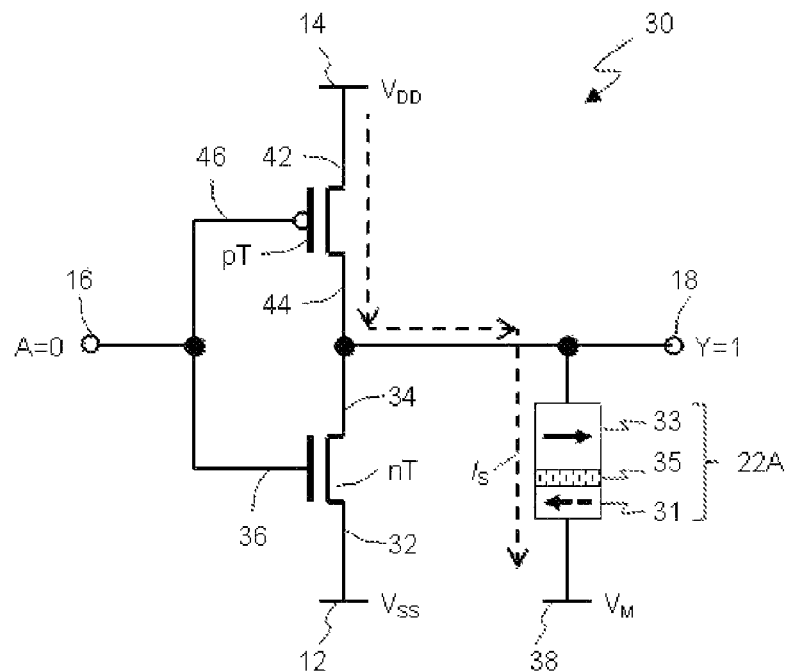

FIGS. 4A and 4B illustrate an operation of the nonvolatile inverter 30 shown in FIG. 3. In this embodiment, when a high input signal A=1 (logic "1") appears at the input terminal 16, the nT transistor is ON but the pT transistor is OFF (FIG. 4A). The potential of the voltage source 38 is higher than that of the voltage source 12 ($V_M > V_{SS}$). Hence a spin polarized current $I_S$ (shown by dashed arrows) appears in the inverter 30 running in a direction from the intermediate voltage source 38 to the low voltage source 12 through the MTJ 22A and the opened transistor nT. Conduction electrons move in a opposite to the current $I_S$ direction. Hence in the MTJ 22A the electrons move from the pinned layer 33 into the free layer 31 through tunnel barrier layer 35. The conduction electrons running through the pinned layer 33 receive a substantial spin polarization. Being injected into the free layer 31 the spin polarized electrons interact with the magnetization of the layer and force it to switch in the direction parallel to the direction of the magnetization in the pinned layer 33 (shown by arrows). Resistance of the MTJ 22A with the parallel direction of the magnetizations in the free 31 and pinned 33 layers $R_P$ has a low value. It corresponds to a logic "0" or to the output signal Y=0. The logic state of the MTJ 22A can be determined comparing it with a resistance of a reference element (not shown).

FIG. 4B illustrates an operation of the nonvolatile inverter 30 when a low signal A=0 (logic "0") appears at the input terminal 16. The transistor pT is ON but the transistor nT is OFF. Since the potential of the voltage source 14 is higher than that of the intermediate source 38 ($V_{DD} > V_M$), the spin polarized current $I_S$ (shown by dashed arrows) in the MTJ 22A is running in direction from $V_{DD}$ to $V_M$. Hence the spin polarized electrons of the current $I_S$ in the MTJ 22A are moving from the free layer 31 to the pinned layer 33 through tunneling barrier layer 35. Being reflected by the pinned layer 33 the electrons force the direction of magnetization in the free layer 31 (shown by dashed arrow) to be oriented antiparallel to the direction of the magnetization in the pinned layer 33 (shown by solid arrow). The resistance $R_{AP}$ of the MTJ 22A with the antiparallel magnetizations in the layer 31 and 33 has a high value. It corresponds to a logic "1" or to the output signal Y=1. A correlation between the input A and output Y signals of the nonvolatile inverter 30 is summarized in Table 1 that is called a truth table.

TABLE 1

| Input A | MTJ Resistance | Output Y |
|---------|----------------|----------|
| 0 | $R_{AP}$ | 1 |
| 1 | $R_P$ | 0 |

Figure 5:
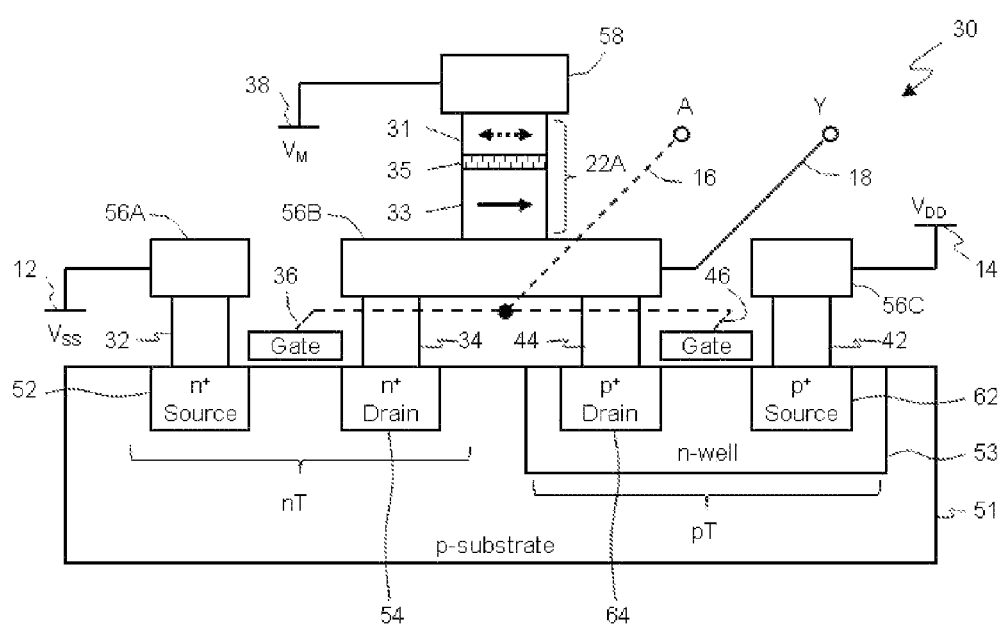
FIG. 5 is a schematic cross-sectional view of the nonvolatile inverter shown in the FIG. 3.

FIG. 5 shows a schematic cross-sectional view of the nonvolatile logic circuit 30 on wafer level. In this embodiment for exemplary purpose the inverter 30 is shown to be formed on a p-type substrate 51 that can be made of Si, Ge, GaAs or similar materials. The inverter 30 comprises the n-channel transistor nT, the p-channel transistor pT, and the MTJ 22A. The transistor nT has a heavily doped $n^+$-type source 52 and drain 54 regions, and the gate terminal 36 over a thin layer of insulator (not shown) that is also called a gate oxide. The $n^+$-source region 52 of the nT transistor is connected by means of the source terminal 32 and a contact 56A to the low voltage source 12. The $n^+$-drain region 54 of the transistor nT by means of the drain terminal 34 and a contact 56B is connected to the drain terminal 44 of the pT transistor, to the output terminal 18, and to the MTJ 22A.

The p-channel transistor pT requires an n-type body region, so an n-well 53 is formed in the p-substrate 51. The pT transistor has a complimentary structure to that of the nT transistor with $p^+$-type source 62 and drain 64 regions, and the gate terminal 46. The gate terminals 36 and 46 of the nT and pT transistors, respectively, are connected in common and to the input terminal 16. The $p^+$-source region 62 of the pT transistor is connected to the high voltage source 14 by means of the source terminal 42 and a contact 56C. The $p^+$-drain region 64 of the transistor pT is connected to the $n^+$-drain region 54 of the transistor nT by means of the drain terminals 44 and 34, and the contact 56B. Moreover, the $n^+$-drain and $p^+$-drain regions of the transistors nT and pT, respectively, are connected to the MTJ 22A, and to the output terminal 18. The MTJ 22A comprises at least the pinned layer 33 adjacent the contact 56B, the free layer 31 adjacent a contact 58, and the tunnel barrier layer 35 disposed between the ferromagnetic layers 33 and 31. The free layer 31 is connected to the voltage source 38 by means of the contact 58. A structure of the MTJ 22A is simplified for illustrative purpose and may comprise several additional layers for providing a required performance.

There is wide latitude for the choice of materials and their thicknesses within various embodiments. The free ferromagnetic layer 31 may have a thickness of about 0.5 nm-3 nm. The free layer 31 can be made of ferromagnetic materials such as Fe, Co, Ni, CoFe, CoFeB, NiFe and/or similar, their based alloys and/or laminates. It should be appreciated that the free layer 31 may comprise various ferromagnetic materials with a substantial spin polarization and can vary dimensionally, including length, width and thickness depending on implementation and desirable magnetic, electrical and other characteristics without departing from the scope of the present application.

The pinned ferromagnetic layer 33 may have a thickness of about 0.5 nm-30 nm. The pinned layer 33 may comprise the ferromagnetic materials such as Fe, Co, Ni, CoFe, CoFeB, NiFe and/or similar, their based alloys and/or laminates. It should be appreciated that the pinned layer 33 may comprise various ferromagnetic materials with a substantial spin polarization and can vary dimensionally, including length, width and thickness depending on implementation and desirable magnetic, electrical and other characteristics without departing from the scope of the present application.

The tunnel barrier layer 35 may comprise an electrically insulating material such as, for example, $Al_2O_3$, $MgO_X$, $TiO_X$, $Ta_2O_5$, $ZrO_X$, $HfO_X$, Mg/MgO or similar, and their based laminates. The tunnel barrier layer 35 may have a thickness of about 0.5 nm-2 nm. It should be appreciated that the tunnel barrier layer 35 may vary dimensionally, including length, width and thickness depending on implementation and desirable electrical and other characteristics without departing from the scope of the present application.

The layers of the MTJ 22A can be made in a manner generally know in the art by deposition techniques (vacuum deposition, sputter deposition, ion-beam deposition and others), photolithography, etching, thermal treatment and other techniques used in a semiconductor and spintronics technologies. During formation of the tunnel barrier layer 35 an oxidation technique (plasma oxidation, oxidation by air or/and similar) may be used.

The terminals 32, 34, 42, 44 and the contacts 56A-56C, 58 can be made of a substantial metallic substance such as Al, AlCu, Cu, Ta/Au/Ta and/or similar materials, and/or their based laminates. The gate terminals 36 and 46 can be made of poly-Si, Al, AlCu and/or other similar materials and/or their based laminates. The terminals and contacts can be made using conventional MOS techniques.

Figure 6A:
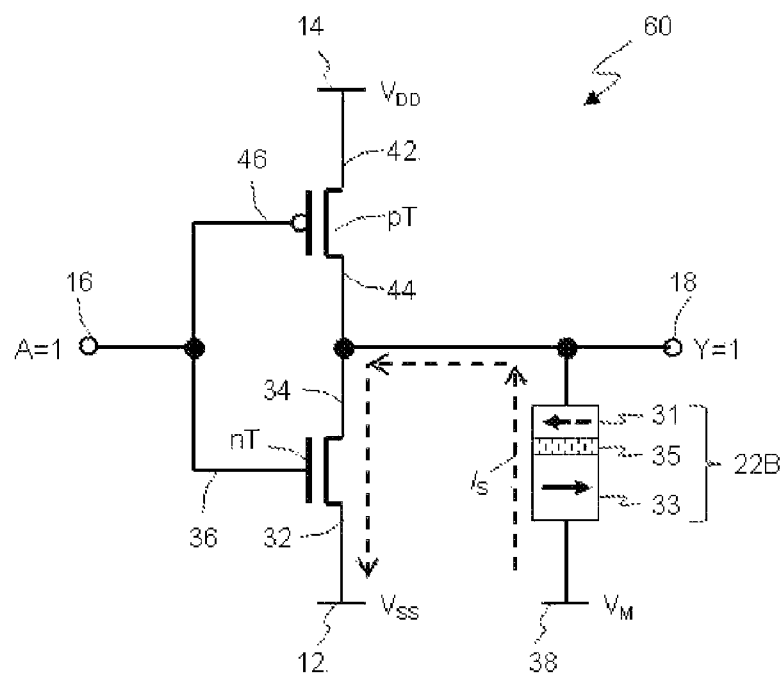
FIGS. 6A and 6B show a circuit diagram of a nonvolatile logic circuit in a write operation mode according to a second embodiment.
Figure 6B:
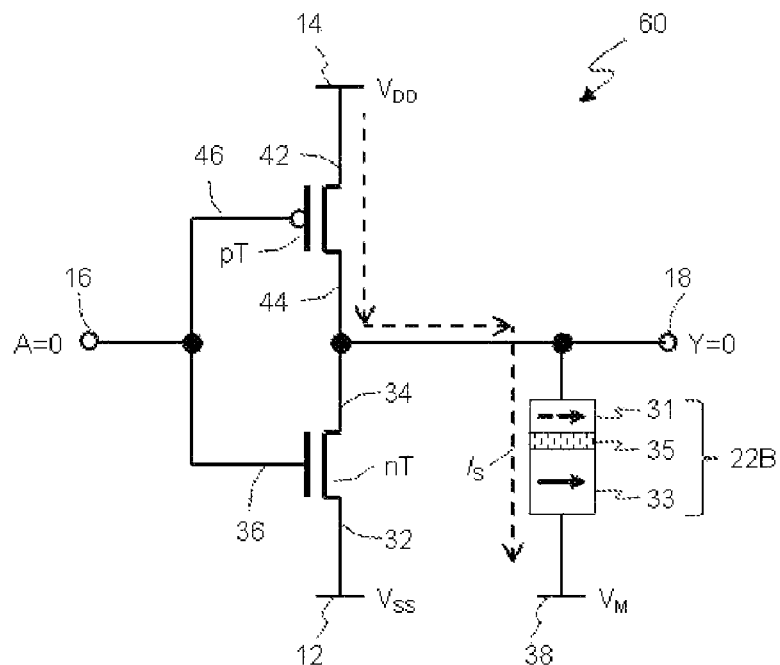

FIGS. 6A and 6B show an nonvolatile logic circuit 60 performing a buffer function according to a second embodiment. Similar to the nonvolatile inverter 30 disclosed above (FIG. 3), the nonvolatile buffer 60 utilizes CMOS technology with one n-channel and one p-channel transistor nT and pT, respectively, connected in series. A source terminal 32 of the transistor nT is connected to a low voltage source 32 ($V_{SS}$), and a source terminal 42 of the pT transistor is connected to a high voltage source 14 ($V_{DD}$). Gate terminals 36 and 46 of the transistors nT and pT, respectively, are connected in common and to an input terminal 16. Similarly, drain terminals 34 and 44 of the transistors nT and pT, respectively, are connected in common and to an output terminal 18. A MTJ 22B is connected to the output terminal 18 at its first end and to an intermediate voltage source 38 ($V_M$) at its second end. More specifically, a pinned layer 33 of the MTJ 22B is disposed adjacent the voltage source 38, and a free layer 33 is disposed adjacent the output terminal 18. Potentials of the voltage sources $V_{SS}$, $V_{DD}$ and $V_M$ satisfy to the following condition: $V_{SS} < V_M < V_{DD}$. The potential of the intermediate source 38 can be $V_M = (V_{DD} - V_{SS})/2$ or $V_M = V_{DD}/2$ when the terminal 32 is connected to a ground terminal. FIGS. 6A and 6B provide a schematic illustration of the MTJ 22B without disclosing for simplicity purpose other layers, which are apparent to people skilled in the art.

When a logic "1" appears at the input terminal 16 (A=1) of the logic circuit 60 (FIG. 6A) the transistor pT is OFF but the transistor nT is ON. A current $I_S$ occurs in a circuit running in a direction from the intermediate source $V_M$ to the low source $V_{SS}$ through the MTJ 22B and the transistor nT. The direction of the current $I_S$ (shown by dashed arrows) is opposite to that of the conduction electrons, which run from the free layer 31 into the pinned layer 33 through tunnel barrier layer 35. The spin polarized electrons force the magnetization (shown by a dashed arrow) in the free layer 31 to be oriented antiparallel to the direction of the magnetization in the pinned layer 33 (shown by solid arrow). The MTJ 22B with the antiparallel magnetizations in the layers 31 and 33 has a high resistance state $R_{AP}$ that corresponds to a logic "1" at the output 18. Hence the nonvolatile logic circuit 60 performs as a logic buffer, wherein the logic state at the input terminal 16 (A=1) is similar to that at the output terminal 18 (Y=1).

FIG. 6B shows a circuit diagram of the logic circuit 60 when a logic "0" appears at the input terminal 16 (A=0). The transistor pT is ON but the transistor nT is OFF. The current $I_S$ is running from the voltage source $V_{DD}$ to the voltage source $V_M$ through the transistor pT and the MTJ 22B. Hence the spin polarized electrons in the MTJ 22B run in the opposite direction from the pinned layer 33 into the free layer 31 through the tunnel barrier layer 35. The electrons force the magnetization of the free layer 31 (shown by dashed arrow) in the direction parallel to the direction of the magnetization of the pinned layer 33 (shown by solid arrow). The parallel orientation of the magnetizations in the free 31 and pinned 33 layers corresponds to a low resistance state $R_P$ of the MTJ 22B or to a logic "0". Hence logic "0" at the input 16 results in the logic "0" at the output 18 of the nonvolatile logic circuit 60. A truth table of the nonvolatile logic circuit 60 is given in Table 2.

TABLE 2

| Input A | MTJ Resistance | Output Y |
|---|---|---|
| 0 | $R_P$ | 0 |
| 1 | $R_{AP}$ | 1 |

Figure 7A:
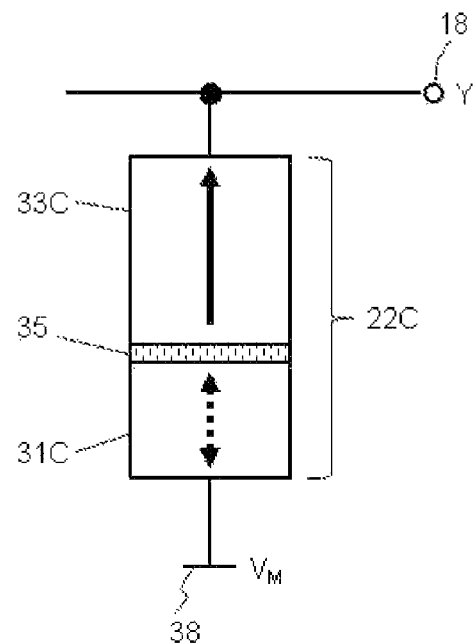
FIGS. 7A and 7B show a schematic structure of magnetic tunnel junctions with an out-of-plane magnetization orientation.
Figure 7B:
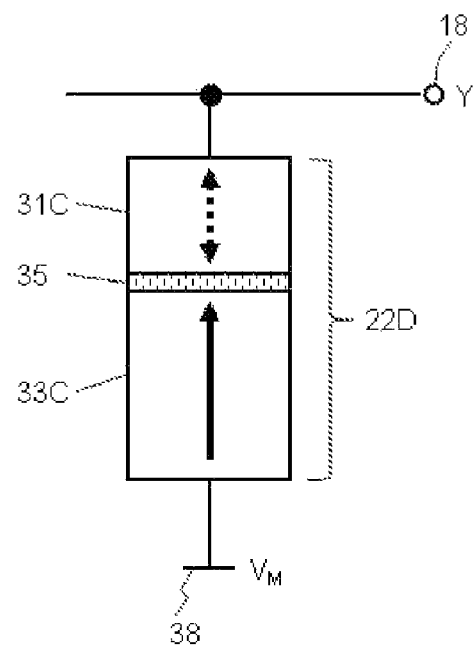

The logic circuits shown in FIG. 3-FIG. 6 disclosed above employ the MTJs 22A and 22B with the in-plane magnetization in the free 31 and pinned 33 layers. However the direction of the magnetization in the ferromagnetic layers 31 and 33 can be oriented perpendicular to the layers plane or out-of plane as shown in FIGS. 7A and 7B. The MTJ 22C (FIG. 7A) can be used in the nonvolatile logic circuit 30 shown in FIGS. 3, 4A, 4B and 5. The MTJ 22D (FIG. 7B) can be used in the nonvolatile logic circuit 60 shown in FIGS. 6A and 6B.

The perpendicular MTJs 22C and 22D can have a substantially higher thermal stability than that of the in-plane MTJs with comparable dimensions due to a substantial intrinsic crystalline anisotropy of the perpendicular ferromagnetic materials. Moreover, the perpendicular MTJs 22C and 22D can have any shape including a round that is not possible in many cases for the in-plane MTJs 22A and 22B, which frequently have to use an elliptical shape. Necessity to use the elliptical shape of MTJ results from the rather week intrinsic crystalline anisotropy of the in-plane ferromagnetic materials.

The free layer 31C may have a thickness of about 0.5 nm-3 nm. The free layer 31C can comprise ferromagnetic materials such as Fe, Co, Ni, CoFe, CoFeB, NiFe, FePt, Co/Pt, Co/Pd, CoFe/Pt, Fe/Pt, Ni/Cu and/or similar, their based alloys and/or laminates. It should be appreciated that the free layer 31C may comprise various ferromagnetic materials with a substantial spin polarization and perpendicular anisotropy or out-of plane direction of the magnetization. The free layer 31C can vary dimensionally, including length, width and thickness depending on implementation and desirable magnetic, electrical and other characteristics without departing from the scope of the present application.

The pinned layer 33C may have a thickness of about 0.5 nm-30 nm. The pinned layer 33C my comprise ferromagnetic materials such as Fe, Co, Ni, CoFePt, CoPtTa, FePt, Co/Pt, Co/Pd, CoFe/Pt, CoFeB/Pt, Ni/Cu and/or similar, their based alloys and/or laminates. It should be appreciated that the pinned layer 33C may comprise various ferromagnetic materials with a substantial spin polarization and perpendicular anisotropy or out-of plane direction of the magnetization. The pinned layer 33C can vary dimensionally, including length, width and thickness depending on implementation and desirable magnetic, electrical and other characteristics without departing from the scope of the present application.

Figure 8:
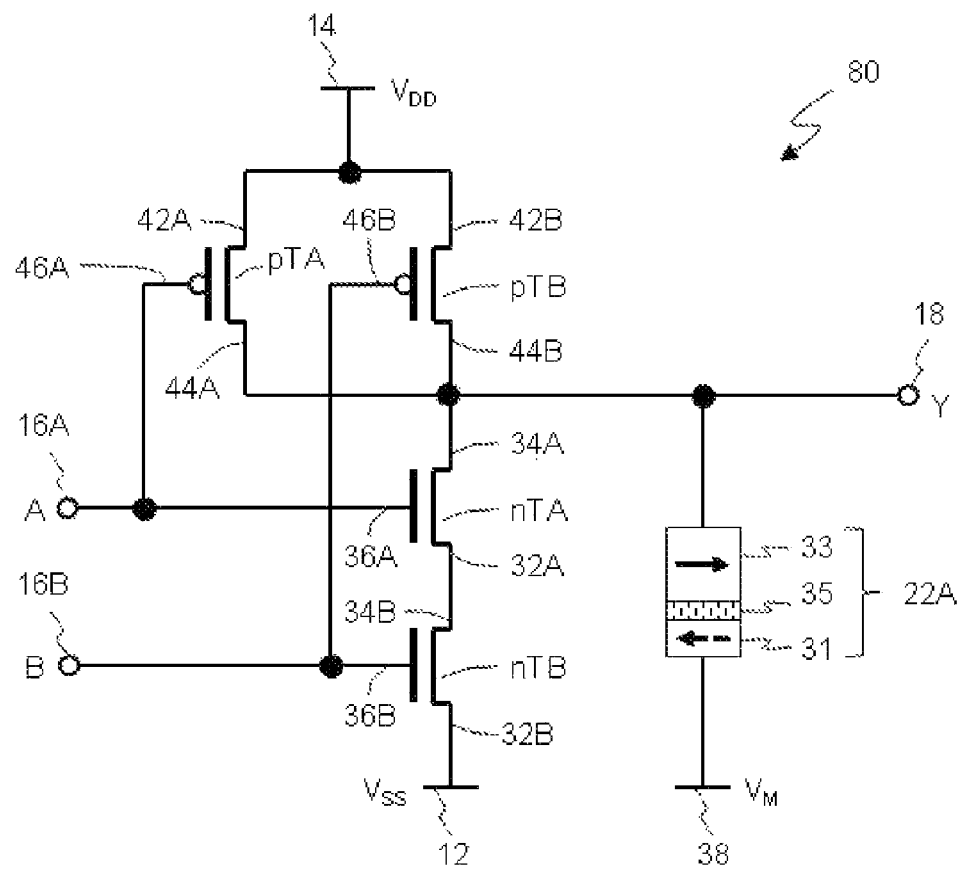
FIG. 8 is a circuit diagram of a nonvolatile NAND logic gate with two input terminals according to a third embodiment.

FIG. 8 shows a circuit diagram of a nonvolatile logic circuit 80 with two input terminals 16A and 16B that performs a NAND logic function. The logic circuit 80 comprises two n-channel MOS transistors nTA and nTB connected in series to each other, two p-channel MOS transistors pTA and pTB connected in parallel to each other, and a MTJ 22A. The n-channel transistors nTA and nTB are disposed between a low voltage source 12 ($V_{SS}$) and an output terminal 18. A source terminal 32B of the transistor nTB is connected to the low voltage source 12 and a drain terminal 34A of the transistor nTA is connected to the output terminal 18. The transistors pTA and pTB are disposed between a high voltage source 14 ($V_{DD}$) and the output terminal 18. Their source terminals 42A and 42B are connected to the high voltage source 14, and drain terminals 44A and 44B are connected to the output terminal 18. A gate terminal 36A of the transistor nTA is connected both to a gate terminal 46A of the transistor pTA and to the input terminal 16A. Likewise a gate terminal 36B of the transistor nTB is connected both to a gate terminal 46B of the transistor pTB and to the input terminal 16B. The MTJ 22A is connected to an intermediate voltage source 38 ($V_M$) at its second end that is adjacent a free layer 31. A first end of the MTJ 22A, which is adjacent a pinned layer 33, is connected to the output terminal 18.

If either input signal A or B is equal to a logic "0", at least one of the n-channel transistors nTA or nTB will be OFF. However at least one of the p-channel transistors pTA or pTB will be ON, creating a path for current from the voltage source $V_{DD}$ to the voltage source $V_M$ through the MTJ 22A. Hence the mutual direction of the magnetizations (shown by arrows) in the free 31 and pinned 33 layers of the MTJ 22A will be antiparallel. It corresponds to a high resistance $R_{AP}$ of the MTJ 22A or to a logic "1" of the output signal Y.

If both input signals are equal to a logic "1" (A=B=1), both n-channel transistors nTA and nTB will be ON and both p-channel transistors pTA and pTB will be OFF. Hence the current will flow from the intermediate voltage source $V_M$ to the low voltage source $V_{SS}$ through the MTJ 22A and the transistors nTA and nTB. This direction of the current will produce a parallel direction of the magnetizations (shown by arrows) in the free 31 and pinned 33 layers. The parallel orientation of the magnetizations results in a low resistance $R_P$ of the MTJ 22A that corresponds to a logic "0" of the output signal Y. A truth table of the logic circuit 80 is given in Table 3.

TABLE 3

| Input A | Input B | MTJ Resistance | Output Y |
|---|---|---|---|
| 0 | 0 | $R_{AP}$ | 1 |
| 0 | 1 | $R_{AP}$ | 1 |
| 1 | 0 | $R_{AP}$ | 1 |
| 1 | 1 | $R_P$ | 0 |

N-input nonvolatile logic circuit performing NAND logic function can be composed by using N n-channel transistors connected in series to each other, N p-channel transistors connected in parallel to each other, and at least one MTJ, connected to the output terminal of the logic circuit. The series n-channel transistors are disposed between the output terminal and the low voltage source $V_{SS}$. The parallel p-channel transistors are disposed between the high voltage source $V_{DD}$ and the output terminal. The MTJ is positioned between the intermediate voltage source $V_M$ and the output terminal, wherein the pinned layer of the MTJ is disposed adjacent the output terminal and the free layer is disposed adjacent the intermediate voltage source $V_M$. A gate terminal of one of the n-channel transistors is connected in common with a gate terminal of one of the p-channel transistors, and both are connected to one of the N-input terminals of the logic circuit.

Figure 9:
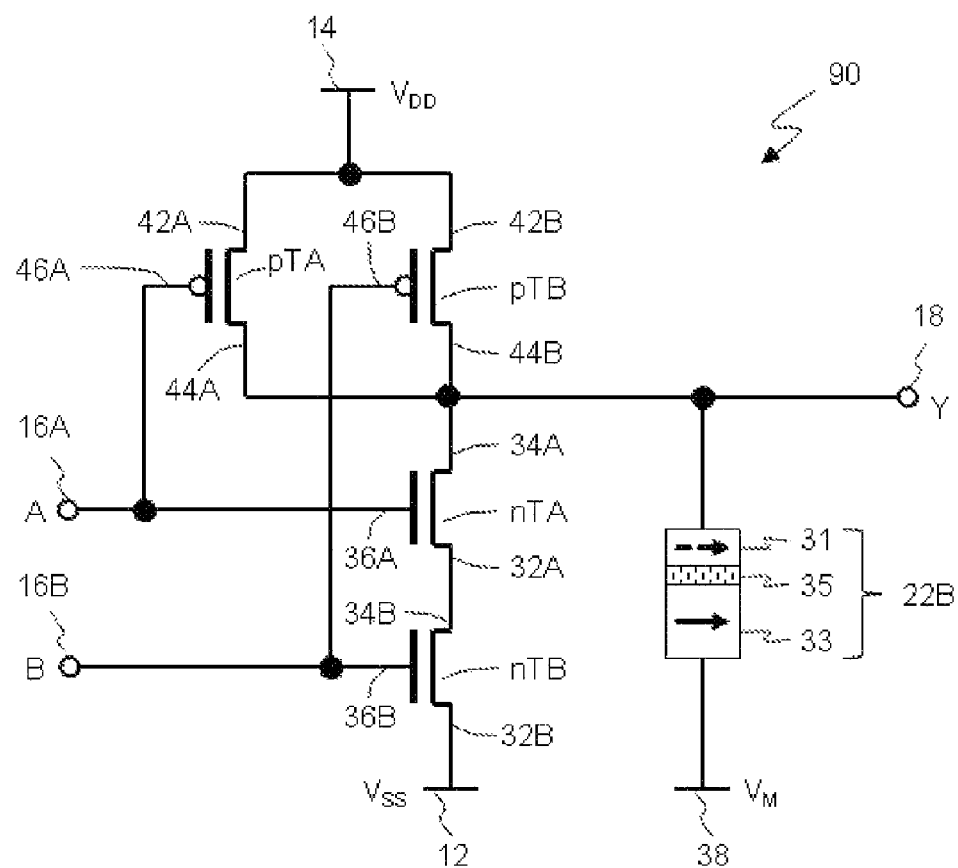
FIG. 9 is a circuit diagram of a nonvolatile AND logic gate with two input terminals according to a fourth embodiment.

FIG. 9 shows a circuit diagram of a 2-input nonvolatile logic circuit 90 according to a fourth embodiment. The logic circuit 90 performs a logic function AND. The circuit 90 has a similar circuit diagram to that of the nonvolatile logic circuit 80 shown in FIG. 8 but comprises a MTJ 22B, wherein the free layer 31 is disposed adjacent the output terminal 18 and the pinned layer 33 is disposed adjacent the intermediate voltage source 38. A reversed position of the free 31 layer relatively to the output terminal 18 in the logic circuit 90 compared to that in the logic circuit 80 results in an reversed polarity of the output signal Y when similar combinations of the signals A and B appear at the input terminals 16A and 16B. A truth table of the nonvolatile logic circuit 90 performing AND function is given in Table 4.

TABLE 4

| Input A | Input B | MTJ Resistance | Output Y |
|---|---|---|---|
| 0 | 0 | $R_P$ | 0 |
| 0 | 1 | $R_P$ | 0 |
| 1 | 0 | $R_P$ | 0 |
| 1 | 1 | $R_{AP}$ | 1 |

Figure 10:
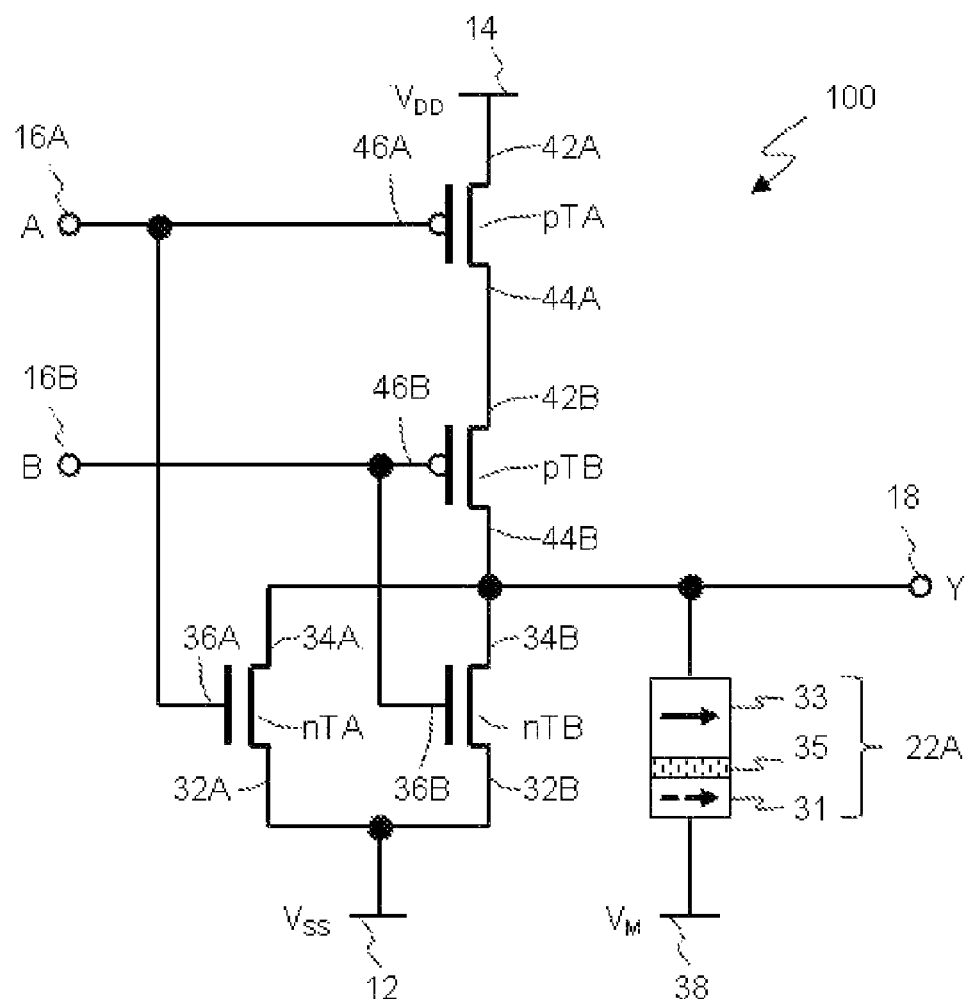
FIG. 10 is a circuit diagram of a nonvolatile NOR logic gate with two input terminals according to a fifth embodiment.

FIG. 10 illustrates a circuit diagram of 2-input nonvolatile logic circuit 100 according to a fifth embodiment. The logic circuit 100 performs a logic function NOR. The circuit 100 comprises two n-channel transistors nTA and nTB connected in parallel to each other, two p-channel transistors pTA and pTB connected in series, and a MTJ 22A. Source terminals 32A and 32B of the n-channel transistors nTA and nTB, respectively, are connected to a low voltage source 12 ($V_{SS}$). Drain terminals 34A and 34B of the n-channel transistors pTA and pTB, respectively, are connected to an output terminal 18, to a drain terminal 44B of the p-channel transistor pTB, and to the MTJ 22A at its first end. A source terminal 42A of the transistor pTA is connected to a high voltage source 14 ($V_{DD}$). Gate terminals 36A and 46A of the nTA and pTA transistors, respectively, are connected in common and to an input terminal 16A. Similarly the gate terminals 36B and 46B of the transistors nTB and pTB are connected in common and to the input terminal 16B. A second end of the MTJ 22A is electrically connected to an intermediate voltage source 38 ($V_M$) having a free layer 31 disposed adjacent the second end.

If either one or both input signals A or B are equal to a logic "1" (FIG. 10), at least one of the n-channel transistors nTA or nTB will be ON but at least one of the p-channel transistors pTA or pTB will be OFF. A current flow in a direction from the intermediate source $V_M$ to the low source $V_{SS}$ through the MTJ 22A and at least one of the n-channel transistors nTA and nTB will occur. Hence spin polarized electrons of the current will run from the pinned layer 33 into the free layer 31 through tunnel barrier layer 35. As a result, a parallel orientation of the magnetizations in the ferromagnetic layers 31 and 33 corresponding to a low resistance $R_P$ of the MTJ 22A will be formed. The low resistance $R_P$ corresponds to a logic "0" at the output (Y=0).

The output signal Y=1 will occur when the input signals A=B=0 appear. Both p-channel transistors pTA and pTB will be ON but the n-channel transistors nTA and nTB will be OFF. The current will flow from the high voltage source $V_{DD}$ to the intermediate source $V_M$ through MTJ 22A and both the p-channel transistors pTA and pTB. This direction of the write current causes the antiparallel orientation of the magnetizations in the free 31 and pinned 33 layers corresponding to a high resistance $R_{AP}$ of the MTJ 22A or to a logic "1" at the output (Y=1). A truth table of the logic circuit 100 is given in Table 5.

TABLE 5

| Input A | Input B | MTJ Resistance | Output Y |
|---|---|---|---|
| 0 | 0 | $R_{AP}$ | 1 |
| 0 | 1 | $R_P$ | 0 |
| 1 | 0 | $R_P$ | 0 |
| 1 | 1 | $R_P$ | 0 |

NOR nonvolatile logic circuit (FIG. 10) comprising N input terminals can be composed by using N n-channel transistors connected in parallel to each other, N p-channel transistors connected in series to each other, and at least one MTJ, connected to the output terminal of the logic circuit. The parallel n-channel transistors are disposed between the output terminal and a low voltage source $V_{SS}$. The series p-channel transistors are disposed between a high voltage source $V_{DD}$ and the output terminal. The MTJ is disposed between the output terminal and an intermediate voltage source $V_M$, wherein a pinned layer of the MTJ is disposed adjacent the output terminal and a free layer is disposed adjacent the intermediate voltage source $V_M$. A gate terminal of one of the n-channel transistors is connected in common with a gate terminal of one of the p-channel transistors, and both are connected to one of the input terminals of the logic circuit.

Figure 11:
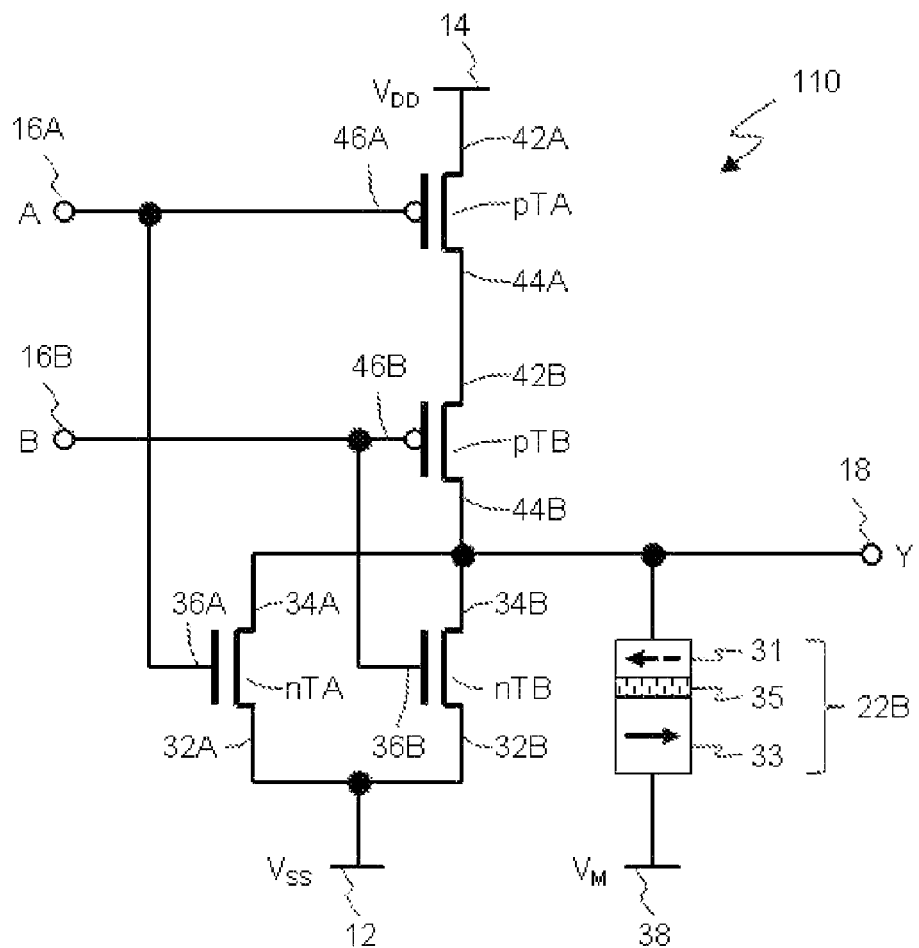
FIG. 11 is a circuit diagram of a nonvolatile OR logic gate with two input terminals according to a sixth embodiment.

FIG. 11 illustrates a circuit diagram of a 2-input nonvolatile logic circuit 110 according to a sixth embodiment. The logic circuit 110 performs a logic function OR. The circuit 110 has the circuit diagram similar to that of the nonvolatile logic circuit 100 shown in FIG. 10 but comprises the MTJ 22B. In the MTJ 22B the free layer 31 is disposed adjacent the output terminal 18 and the pinned layer 33 is disposed adjacent the voltage source $V_M$. The reversed order of the ferromagnetic layers 31 and 33 in the MTJ 22B in the circuit 110 compared to that of the MTJ 22A employed in the circuit 100 results in the reversed magnetization direction of the free layer 31 when similar combination of the input signals is applied. A truth table of the nonvolatile logic circuit 110 is given in Table 6.

TABLE 6

| Input A | Input B | MTJ Resistance | Output Y |
|---|---|---|---|
| 0 | 0 | $R_P$ | 0 |
| 0 | 1 | $R_{AP}$ | 1 |
| 1 | 0 | $R_{AP}$ | 1 |
| 1 | 1 | $R_{AP}$ | 1 |

In general, each of the logic circuits 30, 60, 80-110 disclosed above is realized by using two complementary MOS (CMOS) circuits, a nMOS pull-down circuit comprising at least one n-channel transistor to connect the output terminal 18 to a low voltage source 12 ($V_{SS}$), a pMOS pull-up circuit comprising at least one p-channel transistor to connect the output terminal 18 to a high voltage source 14 ($V_{DD}$), and a MTJ 22 to store the output signal Y. The MTJ 22 is connected to the output terminal 18 at its first end and to an intermediate voltage source 38 ($V_M$) at its second end. The pull-down and pull-up circuits are arranged such that one is ON and the other is OFF for any input pattern.

Figure 12:
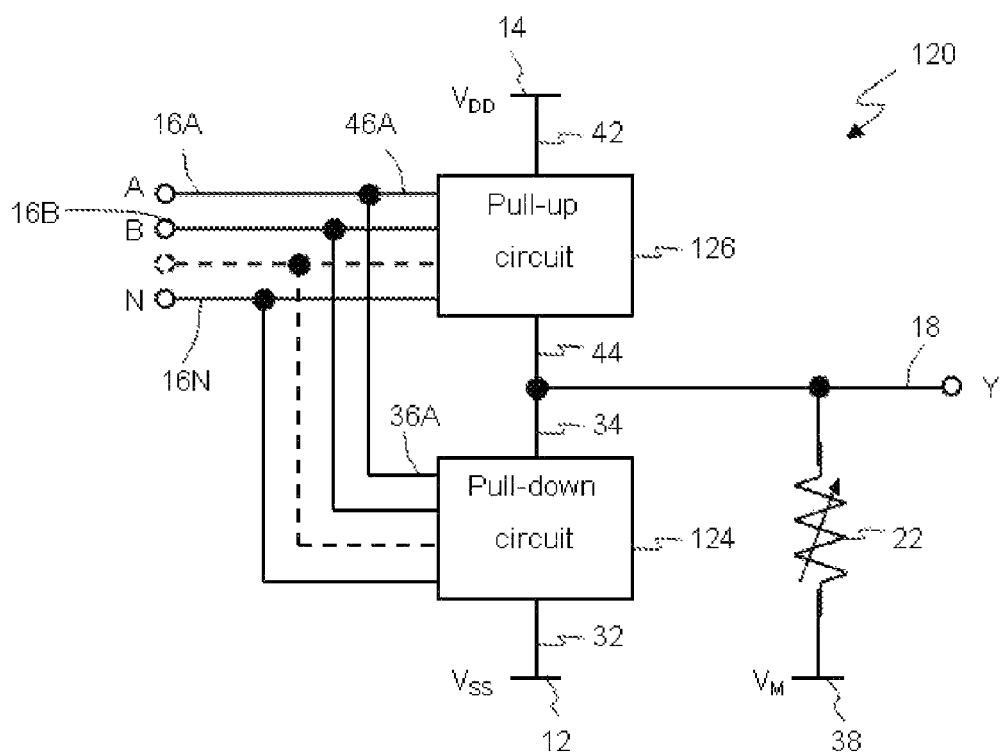
FIG. 12 is a block diagram of a nonvolatile logic circuit with n-input terminals.

A generic block diagram of a nonvolatile logic circuit 120 with N input terminals 16B, 16B, . . . , and 16N is shown in FIG. 12. The logic circuit 120 comprises the pull-down circuit 124, the pull-up circuit 126, and the MTJ 22. The pull-down circuit 124 is connected to the low voltage source 12 by its source terminal 32 and to the output terminal 18 by its drain terminal 34. The pull-up circuit 124 is connected to the high voltage source 14 by its source terminal 42 and to the output terminal 18 by its drain terminal 44. For exemplary purpose the pull-down 124 and pull-up 126 circuits are shown comprising only one source and drain terminal each. Gate terminals 36A and 46A of the pull-down 124 and pull-up 126 circuits, respectively, are connected to the input terminal 16A and so on. The MTJ 22 is connected to the output terminal 18 at its first end and to an intermediate voltage source 38 at its second end. There is a following relation between a voltage potential of the sources: $V_{SS} < V_M < V_{DD}$. The voltage potential of the intermediate source $V_M$ can be: $V_M = (V_{DD} - V_{SS})/2$. If the potential of the low voltage source $V_{SS}$ is connected to a ground ($V_{SS}=0$), the potential of the intermediate source can be equal to $V_M = V_{DD}/2$.

Figure 13:
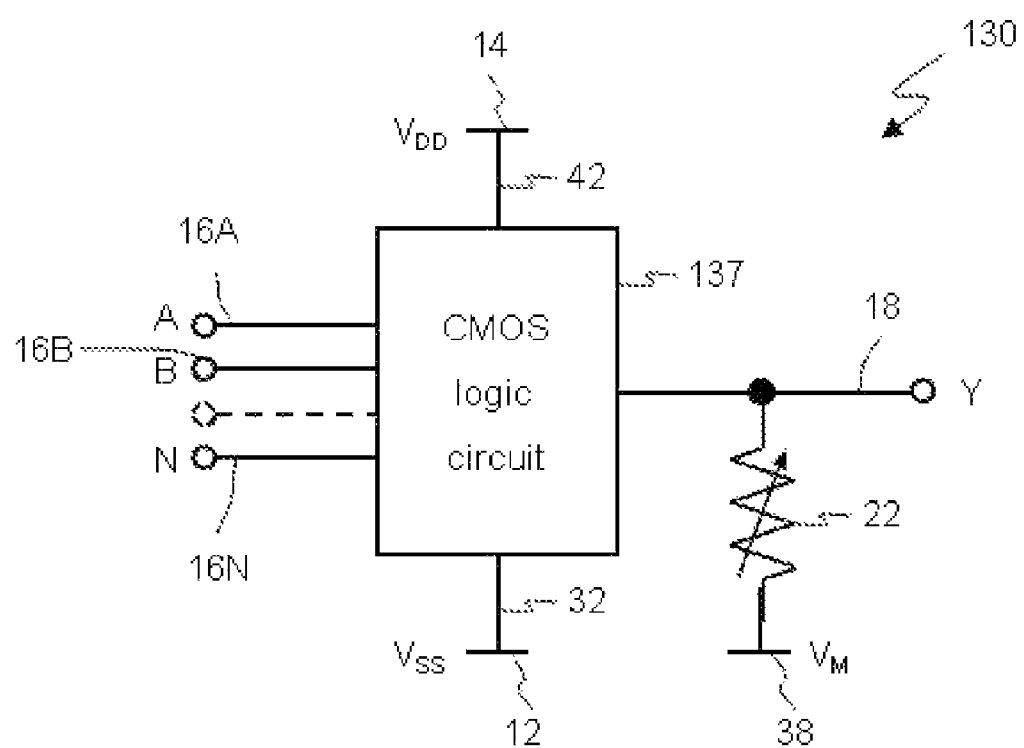
FIG. 13 is another view of the block diagram of the nonvolatile logic circuit shown in the FIG. 12.

FIG. 13 illustrates another schematic view of the block diagram of the nonvolatile logic circuit 120 shown in FIG. 12. The circuit 130 comprises a CMOS logic circuit 137 having N input terminals 16A, 16B, . . . , 16N and an output terminal 18. The logic circuit 137 is connected to a low voltage source 12 ($V_{SS}$) by mean of one source terminal 32 and to a high voltage source 14 ($V_{DD}$) by another source terminal 42. The logic state of the CMOS circuit 137 is controlled by an input signal A, B, . . . , N, or their combination applied to at least one of the input terminals 16A-16N. The CMOS logic circuit 137 is volatile and loses its logic state when the power is off. A nonvolatile MTJ 22 is connected to the output terminal 18 at its first end to an intermediate voltage source 38 ($V_M$) at its second end. The nonvolatile MTJ 22 preserves the logic state of the CMOS circuit 137 during a loss of the power.

While the specification of this application contains many specifics, these should not be construed as limitations on the scope of the application or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It is understood that the above application is intended to be illustrative, and not restrictive. Many other embodiments will be apparent to those of skill in the art upon reviewing the above description. The scope of the embodiments should be,

What is claimed is:

1. A nonvolatile logic circuit comprising:
an output terminal;
a pull-up circuit, said pull-up circuit comprising at least one source terminal, at least one drain terminal, and at least one gate terminal, wherein the at least one source terminal is connected to a high voltage source and the at least one drain terminal is connected to the output terminal;
a pull-down circuit, said pull-down circuit comprising at least one source terminal, at least one drain terminal, and at least one gate terminal, wherein the at least one source terminal of the pull-down circuit is connected to a low voltage source and the at least one drain terminal of the pull-down circuit is connected to the output terminal;
at least one input terminal, said at least one input terminal is connected to the at least one gate terminal of the pull-up circuit and to the at least one gate terminal of the pull-down circuit;
a magneto-resistive device, said magneto-resistive device comprising a first end and a second end, wherein the magneto-resistive device is connected to the output terminal at the first end and to an intermediate voltage source at the second end; and
wherein a potential of the intermediate voltage source is higher than the potential of the low voltage source but lower than the potential of the high voltage source.

2. The nonvolatile logic circuit of claim 1, wherein the pull-up circuit comprises at least one p-channel MOS transistor.

3. The nonvolatile logic circuit of claim 1, wherein the pull-down circuit comprises at least one n-channel MOS transistor.

4. The nonvolatile logic circuit of claim 1, wherein the magneto-resistive device comprises at least a pinned ferromagnetic layer having a fixed magnetization direction, a free ferromagnetic layer having a reversible magnetization direction, and a tunnel barrier layer, wherein said tunnel barrier layer is disposed between said pinned ferromagnetic layer and said free ferromagnetic layer.

5. The nonvolatile logic circuit of claim 4, wherein the free ferromagnetic layer is disposed adjacent to the first end of the magneto-resistive device.

6. The nonvolatile logic circuit of claim 4, wherein the free ferromagnetic layer is disposed adjacent to the second end of the magneto-resistive device.

7. The nonvolatile logic circuit of claim 4, wherein the magnetization direction of the free and pinned ferromagnetic layers is disposed substantially in a plane of the layers in an equilibrium state.

8. The nonvolatile logic circuit of claim 4, wherein the magnetization direction of the free and pinned ferromagnetic layers is disposed substantially perpendicular to the plane of the layers in the equilibrium state.

9. A method for preserving a selective logic state, the method comprising:
providing a complimentary MOS logic circuit comprising, a first source terminal, a second source terminal, at least one input terminal, an output terminal, to temporarily store the selective logic state with a power dependent status;
providing a low voltage source connected to the first source terminal and a high voltage source connected to the second source terminal of the complementary MOS logic circuit;
providing a magneto-resistive device to independently store the selective logic state in a manner so as to prevent a loss of the selective logic state during a power interruption comprising, a first end and a second end, wherein said magneto-resistive device is connected to the output terminal at the first end and to an intermediate voltage source at the second end, wherein a potential of the intermediate voltage source is higher than that of the low voltage source but lower than that of the high voltage source;
controlling the selective logic state of the magneto-resistive device by a selective input signal applied to the at least one input terminal.

10. The method of claim 9, wherein the complementary MOS logic circuit comprising at least one n-channel transistor having the first source terminal, a drain terminal and a gate terminal, and at least one p-channel transistor having the second source terminal, a drain terminal and a gate terminal.

11. The method of claim 10, wherein the first source terminal is connected to the low voltage source, the second source terminal is connected to the high voltage source, the drain terminal of the at least one p-channel transistor and the drain terminal of the at least one n-channel transistor are connected to the output terminal, and the gate terminal of the at least one n-channel transistor and the gate terminal of the at least one p-channel transistor are connected to the at least one input terminal.

12. The method of claim 9, wherein the magneto-resistive device comprising at least one free ferromagnetic layer with a reversible magnetization direction, at least one pinned ferromagnetic layer with a fixed magnetization direction, and at least one tunnel barrier layer disposed between said at least one free and pinned ferromagnetic layers.

13. The method of claim 12, wherein the direction of the magnetization in the free ferromagnetic layer is controlled by the selective input signal applied to the at least one input terminal.

14. A nonvolatile logic circuit comprising:
at least one input terminal;
an output terminal;
at least one p-channel transistor, said at least one p-channel transistor comprising a source terminal, a drain terminal, and a gate terminal, wherein said source terminal is connected to a high voltage source, said drain terminal is connected to the output terminal, and said gate terminal is connected to the at least one input terminal;
at least one n-channel transistor, said at least one n-channel transistor comprising a source terminal, a drain terminal, and a gate terminal, wherein said source and drain terminals of the at least one n-channel transistor are connected to a low voltage source and to the output terminal, respectively, and said gate terminal is connected to the at least one input terminal and to the gate terminal of the at least one p-channel transistor;
a magnetic tunnel junction, said magnetic tunnel junction comprising a first end and a second end, wherein said first end is connected to the output terminal and said second end is connected to an intermediate voltage source; and
wherein a potential of the intermediate voltage source is higher than that of the low voltage source but lower than that of the high voltage source.

15. The nonvolatile logic circuit of claim 14, wherein the magnetic tunnel junction comprising a free ferromagnetic layer having a reversible magnetization direction, a pinned ferromagnetic layer having a fixed magnetization direction, and a tunnel barrier layer disposed between the free and pinned ferromagnetic layers.

16. The nonvolatile logic circuit of claim 15, wherein the magnetization direction of the free and pinned ferromagnetic layers is disposed substantially in a plane of the layers in an equilibrium state.

17. The nonvolatile logic circuit of claim 15, wherein the magnetization direction of the free and pinned ferromagnetic layers is disposed substantially perpendicular to the plane of the layers in the equilibrium state.

18. The nonvolatile logic circuit of claim 15, wherein the free ferromagnetic layer is disposed adjacent to the first end of the magnetic tunnel junction.

19. The nonvolatile logic circuit of claim 15, wherein the free ferromagnetic layer is disposed adjacent to the second end of the magnetic tunnel junction.

* * * * *